United States Patent
Cheung

(10) Patent No.: US 6,791,371 B1
(45) Date of Patent: Sep. 14, 2004

(54) POWER-DOWN ACTIVATED BY DIFFERENTIAL-INPUT MULTIPLIER AND COMPARATOR

(75) Inventor: Hung-Yan Cheung, Milpitas, CA (US)

(73) Assignee: Pericom Semiconductor Corp., San Jose, CA (US)

(*) Notice: Subject to any disclaimer, the term of this patent is extended or adjusted under 35 U.S.C. 154(b) by 0 days.

(21) Appl. No.: 10/249,280

(22) Filed: Mar. 27, 2003

(51) Int. Cl.[7] ............................................. H03K 5/22
(52) U.S. Cl. ............................................. 327/63; 327/65
(58) Field of Search .......................... 327/58, 62, 63, 327/65, 66, 89, 20, 30, 69, 70; 326/30, 86

(56) References Cited

U.S. PATENT DOCUMENTS

| | | | |
|---|---|---|---|
| 4,408,283 A | 10/1983 | Kovalchik et al. | 702/61 |
| 4,558,283 A | 12/1985 | Yamagiwa | 327/113 |
| 4,694,204 A | 9/1987 | Nishijima et al. | 327/359 |
| 4,887,071 A | 12/1989 | Virdee | 340/659 |
| 5,107,150 A | 4/1992 | Kimura | 327/349 |
| 5,561,390 A | 10/1996 | Hiiragizawa | 327/147 |
| 5,574,755 A | 11/1996 | Persico | 375/295 |
| 5,587,687 A | 12/1996 | Adams | 330/253 |
| 5,754,073 A | 5/1998 | Kimura | 327/359 |
| 5,872,446 A | 2/1999 | Cranford, Jr. et al. | 323/315 |
| 6,020,768 A * | 2/2000 | Lim | 327/77 |
| 6,163,172 A | 12/2000 | Bazuin et al. | 326/93 |
| 6,201,424 B1 | 3/2001 | Harrison | 327/159 |
| 6,222,392 B1 | 4/2001 | Guo et al. | 327/21 |
| 6,294,932 B1 * | 9/2001 | Watarai | 326/83 |

* cited by examiner

Primary Examiner—Tuan T. Lam
(74) Attorney, Agent, or Firm—Stuart T. Auvinen

(57) ABSTRACT

A power-down mode is activated when equal voltages are detected on a pair of differential inputs. The voltage difference across the differential inputs is applied to a multiplier, which generates a squared difference. The squared difference is smoothed and filtered by a low-pass filter to produce an average signal. The average signal is compared to a reference voltage, either explicitly or implicitly, to detect when the voltage difference across the differential inputs is too small. A power-down signal is activated when the average signal is too small. The multiplier can be implemented with a Gilbert cell, while a filter-comparator converts the differential Gilbert-cell output to a single-ended signal and filters the signal. The reference voltage compared can be set by the switching threshold of the filter comparator or other logic gates. A complementary Gilbert cell and filter-comparator can be used to increase the operating range.

20 Claims, 4 Drawing Sheets

POWER-DOWN ACTIVATED BY DIFFERENTIAL-INPUT MULTIPLIER AND COMPARATOR

BACKGROUND OF THE INVENTION

This invention relates to electronic systems, and more particularly to powering down when equal voltages are detected on differential inputs.

Many electronic systems use differential signaling to improve speed and noise immunity. A pair of differential signals has one signal line driven high when the other signal line is driven low to transmit a bit of data. The difference in voltage between the two signal lines in the differential pair, rather than the absolute voltages, determines the data state.

Failures can occur, such as when a cable carrying a differential pair breaks or is accidentally disconnected. Fail-safe circuits are sometimes added to differential inputs to detect when such a cable break occurs. Often a load resistor at the receiver side of a cable connects the two signal lines in the differential pair. When the cable is disconnected, the load resistor equalizes the voltages on the two signal lines until both signal-line inputs to the differential receiver have the same voltage. This same-voltage condition is detected by the differential receiver, and the output of the differential receiver is forced to a known state, rather than left in an unstable or undefined state.

Rather than simply force the differential receiver output to a known state, detection of equal voltages on the differential input signal lines can be used to power-down a circuit or sub-system. See for example, "Power Down Mode Signaled by Differential Transmitter's High-Z State Detected by Receiver Sensing Same Voltage on Differential Lines", U.S. Ser. No. 10/064,074, filed Jun. 7, 2002, and assigned to Pericom Semiconductor Corp. of San Jose, Calif.

While such an equal-voltage detector for power-down control is useful, a more advanced detector is desired for detecting the equal-voltage condition on a pair of differential lines. An advanced equal-voltage detector and power-down circuit is desired.

DETAILED DESCRIPTION

The present invention relates to an improvement in differential detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
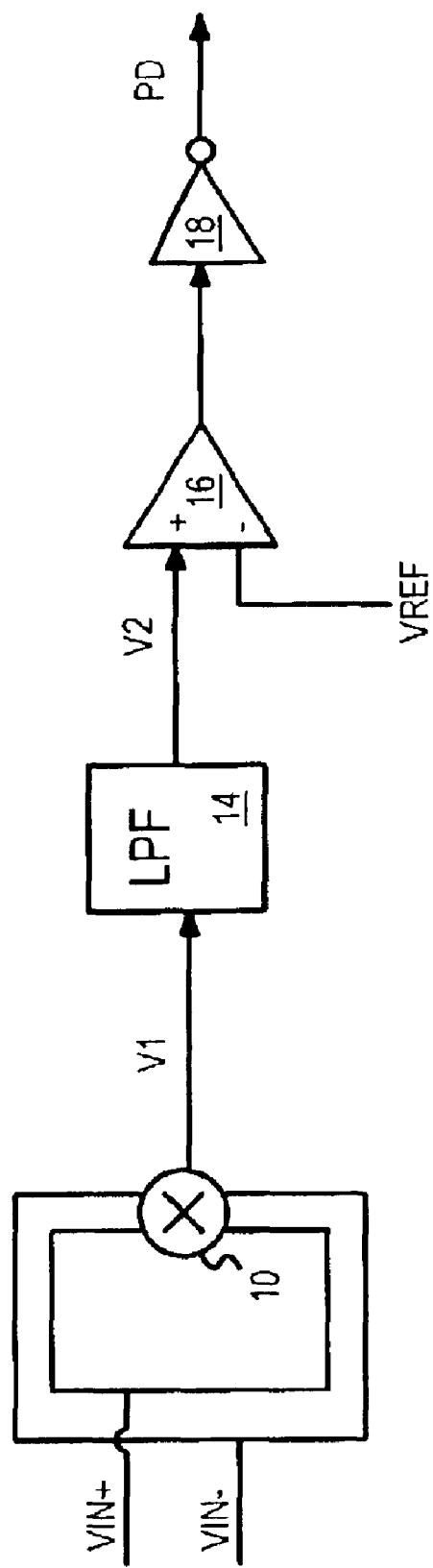
FIG. 1 is a block diagram of an equal-voltage detector for a differential input.

FIG. 1 is a block diagram of an equal-voltage detector for a differential input. The voltages on a pair of differential inputs are normally different, except for a brief moment at cross-over during switching. When the voltages are equal, a failure is usually the cause, such as when a cable carrying the differential pair is disconnected or broken.

Differential inputs VIN+, VIN− are normally driven to opposite states by a differential transmitter (not shown). A load resistor (not shown) between VIN+ and VIN− equalizes the two voltages when the transmitter no longer drives the differential inputs, such as when the transmitter is disconnected due to a cable break.

Differential inputs VIN+, VIN− are input to differential multiplier 10, in both the normal and reverse connections (VIN+, VIN−, and VIN−, VIN+). The voltage difference (VIN+−VIN−) is multiplied by the reverse voltage difference (VIN−−VIN+) by differential multiplier 10. When the amplitude of the voltage difference is A, the output of differential multiplier 10 is $A^2$. For a sine-wave input, the averaged output of differential multiplier 10 is $A^2/2$.

The output of differential multiplier 10, voltage V1, is filtered by low-pass filter 14 to produce a smoothed or averaged voltage V2. This averaged voltage V2 can be the average over several cycles of the differential input at the target switching frequency.

The averaged voltage V2 is applied to the non-inverting (+) input of differential comparator 16. The inverting input (−) of differential comparator 16 receives a reference voltage VREF. When V2 is above VREF, differential comparator 16 outputs a high to inverter 18, which drives power-down signal PD low (inactive).

When V2 is below VREF, differential comparator 16 outputs a low to inverter 18, which drives power-down signal PD high (active). Since V2 is proportional to the square of the absolute voltage difference between differential inputs VIN+, VIN−, V2 is a measure of the differential signal strength. When a failure occurs and VIN+, VIN− equalize, V2 drops to zero. Reference voltage VREF can be set to a predetermined value that is below V2 during normal operation, but above V2 when differential inputs VIN+, VIN− are equalized. The exact value of VREF used can be estimated or determined by circuit simulation, and a range of values may be substituted. Sensitivity of the power-down detector can be increased by lowering VREF, while false triggering can be reduced by increasing VREF.

Figure 2:
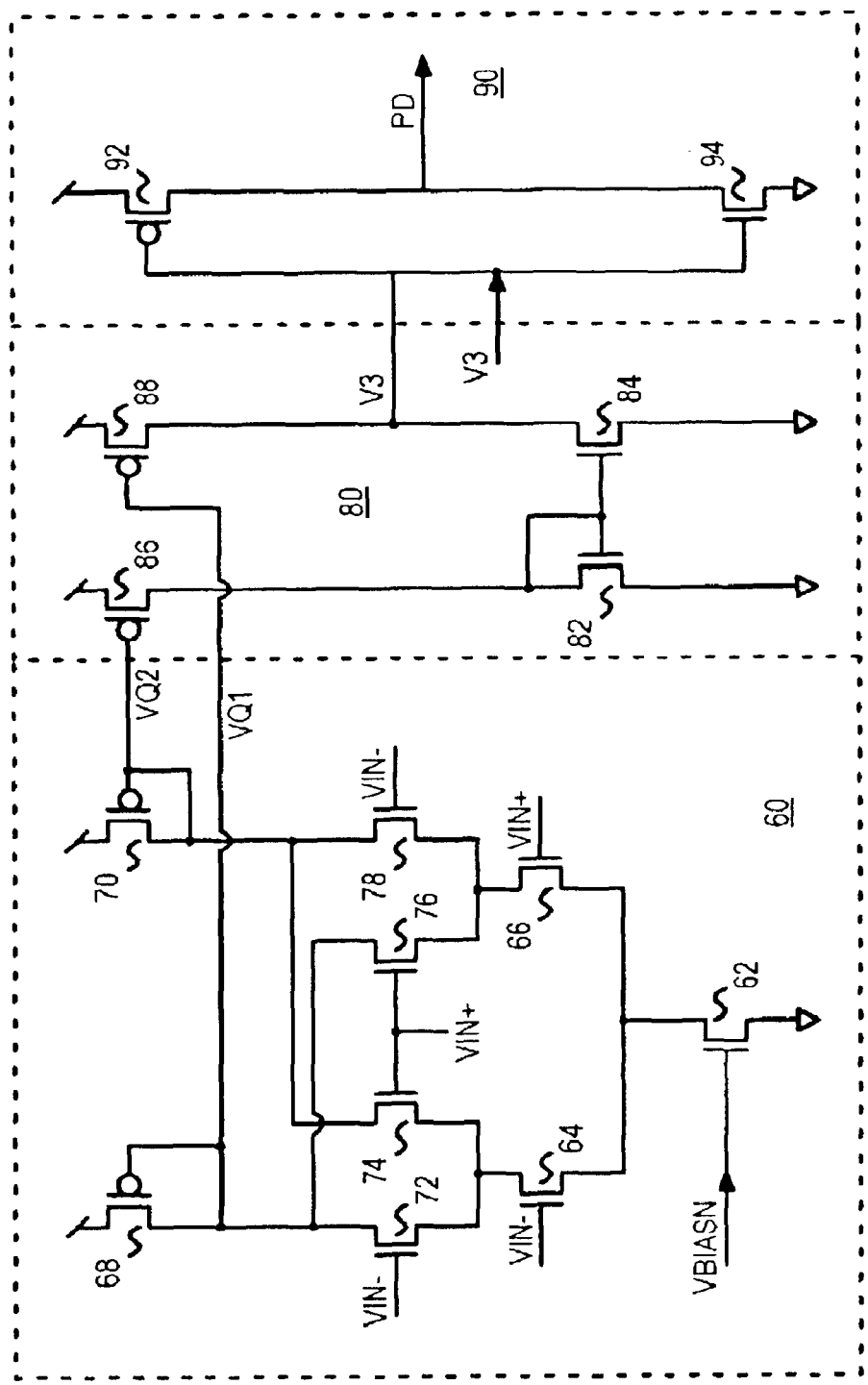
FIG. 2 is a schematic of a first part of a differential equal-voltage detector.

FIG. 2 is a schematic of a first part of a differential equal-voltage detector. Differential inputs VIN+, VIN− are applied to first differential multiplier 60, which is a Gilbert multiplier. N-channel tail transistor 62 receives a bias voltage BIASN on its gate, and sinks a constant current that is combined from the four legs of n-channel multiplier transistors 72, 74, 76, 78. P-channel current source transistors 68, 70 each have their gates and drains connected together. The gate and drain of p-channel source transistor 68 is node VQ1, while gate and drain of p-channel source transistor 70 is node VQ2. Nodes VQ1, VQ2 are the outputs of first differential multiplier 60.

Differential-to-single-ended conversion is performed by first filter comparator 80. The filtering and comparing functions are combined. Filtering is provided by drain resistance of transistors 88, 84 of first filter comparator 80 and the gate capacitances of transistors 92, 94 of inverter 90. Rather than explicitly compare the outputs of first differential multiplier 60 to a reference voltage VREF, the reference voltage is implicitly determined by the switching voltage of first filter comparator 80 and inverter 90.

The VQ1 output of first differential multiplier 60 is applied to the gate of p-channel transistor 88, while the VQ2 output of first differential multiplier 60 is applied to the gate of p-channel transistor 86. Mirrored current is provided to the drains of transistors 86, 88 by n-channel mirror transistors 82, 84, respectively, which have their gates connected together and to the drain of n-channel mirror transistor 82. The drains of n-channel mirror transistor 84 and p-channel transistor 88 are the V3 output of first filter comparator 60. When voltage V3 is above the switching threshold of transistors 92, 94 of inverter 90, then power-down output PD is driven low (inactive). When voltage V3 is below the switching threshold of transistors 92, 94 of inverter 90, then power-down output PD is driven high (active).

Operation—FIG. 2

During normal operation when VIN+ is higher than VIN−, multiplier transistors 74, 76, which receive VIN+ at their gates, have a higher transconductance than multiplier transistors 72, 78, which receive VIN− at their gates. Multiplier transistors 72, 78 tend to turn off when VIN− goes low.

Thus changes in current through n-channel differential transistor 64 are coupled to p-channel current-source transistor 70 through multiplier transistor 74, while changes to current through n-channel differential transistor 66 are coupled to p-channel current-source transistor 68 through multiplier transistor 76.

The higher VIN− causes more current to pass through differential transistor 66 than through differential transistor 64. The increased current through transistor 66 pulls more current from current-source transistor 68, causing its gate and drain, node VQ1, to fall in voltage. This lower VQ1 voltage increases the current through p-channel transistor 88. The higher current sourced by transistor 88 raises the voltage of node V3, and inverter 90 drives PD low (inactive).

The lower VIN− produces less current through transistor 64. The lower current through transistor 64 pulls less current from current-source transistor 70, causing its gate and drain, node VQ2, to rise in voltage. This higher VQ2 voltage decreases the current through p-channel transistor 86. The reduced current sourced by transistor 86 also reduces the current through n-channel transistor 82, causing Its gate voltage to fall and reduce the current through n-channel transistor 84. This reduces the pull-down current from node V3 and thus helps raise the voltage of node V3, and inverter 90 drives PD low (inactive).

During normal operation when VIN− is higher than VIN+, multiplier transistors 74, 76, which receive VIN+ at their gates, have a lower transconductance than multiplier transistors 72, 78, which receive VIN− at their gates. Multiplier transistors 74, 76 tend to turn off when VIN+ goes low.

Changes in current through n-channel differential transistor 64 are coupled to p-channel current-source transistor 68 through multiplier transistor 72, while changes in current through n-channel differential transistor 66 are coupled to p-channel current-source transistor 70 through multiplier transistor 78.

The higher VIN− causes more current to pass through differential transistor 64 than through differential transistor 66. The increased current through transistor 64 pulls more current from current-source transistor 68, causing its gate and drain, node VQ1, to fall in voltage. This lower VQ1 voltage increases the current through p-channel transistor 88. The higher current sourced by transistor 88 raises the voltage of node V3, and inverter 90 drives PD low (inactive).

The lower VIN+ produces less current through transistor 66. The lower current through transistor 66 pulls less current from current-source transistor 70, causing its gate and drain, node VQ2, to rise in voltage. This higher VQ2 voltage decreases the current through p-channel transistor 86. The reduced current sourced by transistor 86 also reduces the current through n-channel transistor 82, causing its gate voltage to fall and reduce the current through n-channel transistor 84. This reduces the pull-down current from node V3 and thus helps raise the voltage of node V3, and inverter 90 drives PD low (inactive).

Thus when either VIN+ or VIN− is higher, more current is sourced by current-source transistor 68 than by transistor 70, and node VQ1 is lower than VQ2, driving node V3 high and PD low.

When VIN+ and VIN− are equal in voltage, the same current passes through all four multiplier transistors 72, 74, 76, 78, since these have the same size. Differential transistors 64, 66 also sink identical currents, since these two transistors are the same size. Thus source currents through p-channel current-source transistors 68, 70 are nearly identical, causing nodes VQ1, VQ2 to have the same voltage.

Different sizes are used for p-channel transistors 86, 88 in first filter comparator 80. Transistor 86 is larger than transistor 88, so that when VQ1 and VQ2 are equal, more current is sourced by transistor 86 than transistor 88. The larger current in transistor 86 draws more current through n-channel transistor 82, raising its gate voltage. This increases the pull-down current from node V3 through n-channel transistor 84, lowering V3. Since the voltage of VQ1 is less when VIN+, VIN− have a differential voltage, and more when VIN+ and VIN− are equal, the higher VQ1 reduces the source current through transistor 88, allowing node V3 to fall. The lower V3 is inverted by inverter 90, driving power-down signal PD high, activating the power-down mode.

Figure 3:
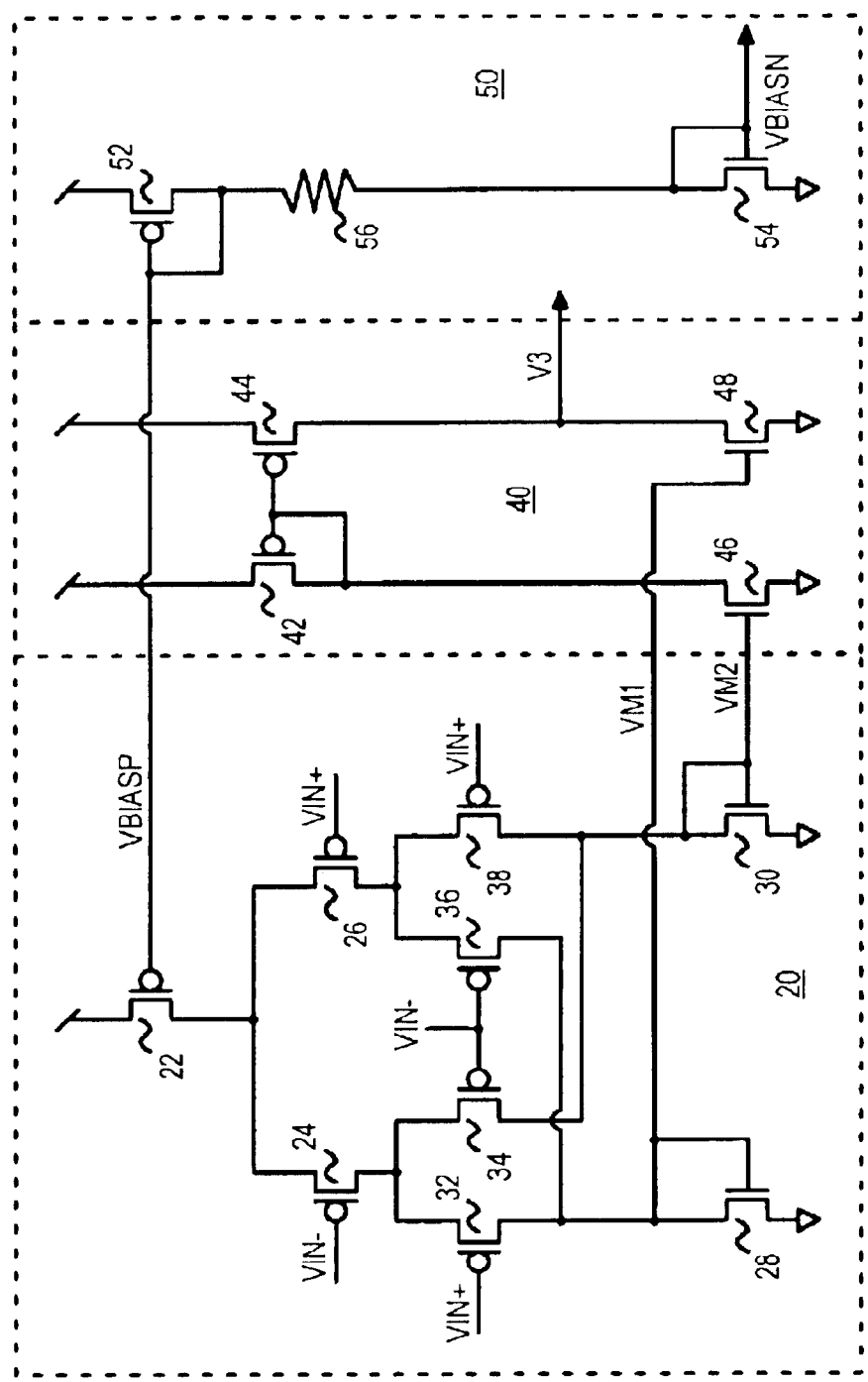
FIG. 3 is a schematic of a complementary part of a differential equal-voltage detector.

FIG. 3 is a schematic of a complementary part of a differential equal-voltage detector. Differential inputs VIN+, VIN− are applied to second differential multiplier 20, which is a Gilbert multiplier using complementary devices. The p-channel and n-channel transistors are generally reversed compared with FIG. 2. Operating principles are similar.

While first differential multiplier 60 operates well when the common-mode voltage of VIN+, VIN− is above Vcc/2, performance can be degraded for voltages below Vcc/2. Second differential multiplier 20 and second filter comparator 40 having complementary devices are added to operate when the common-mode input voltage is below Vcc/2.

Bias generator 50 generates bias voltage BIASP that is applied to the gate of p-channel tail transistor 22, which supplies current to all legs of second differential multiplier 20. Bias generator 50 also generates BIASN for n-channel tail transistor 62 in second differential multiplier 60 of FIG. 2. Bias generator 50 is a voltage divider of p-channel transistor 52, resistor 56, and n-channel transistor 54. The gate and drain of p-channel transistor 52 generate bias BIASP, while gate and drain of n-channel transistor 55 generate bias BIASN.

The current from p-channel tail transistor 22 is split into two legs at the drain of transistor 22. One current leg passes through p-channel differential transistor 24, which has VIN− at its gate, while the other current leg passes through p-channel differential transistor 26, which has VIN+ at its gate. When VIN+, VIN− are equal voltages, the same current passes through each leg. Non-equal VIN+, VIN− produce a current difference in the two legs.

The drain of p-channel differential transistor 24 is connected to the sources of p-channel multiplier transistors 32, 34, which receive voltages VIN+, VIN−, respectively at their gates. This further splits current through transistor 24 into two legs. Similarly, the drain of p-channel differential transistor 26 is connected to the sources of p-channel multiplier transistors 36, 38, which receive voltages VIN−, VIN+, respectively at their gates. This further splits current through transistor 26 into two legs. The source current of tail transistor 22 is thus split into a total of four current legs, through transistors 32, 34, 36, 38.

The currents through multiplier transistors 32, 36 are combined since their drains are connected together. This combined current is sunk by n-channel current-sink transistor 28, which has its gate and drain connected together as output node VM1 from second differential multiplier 20. This combined current includes one current through transistors 24, 32, and another current through transistors 26, 36. The gates of transistors 24, 32 are VIN−, VIN+, respectively, while gates of transistors 26, 36 are VIN+, VIN−, respectively.

The VM1 output of second differential multiplier 20 is applied to the gate of n-channel transistor 48, while the VM2 output of second differential multiplier 20 is applied to the gate of n-channel transistor 46. Mirrored current is provided to the drains of transistors 46, 48 by p-channel mirror transistors 42, 44, respectively, which have their gates connected together and to the drain of p-channel mirror transistor 42. The drains of p-channel mirror transistor 44 and n-channel transistor 48 are the V3 output of first filter comparator 40.

The currents from first filter comparator 80 and second filter comparator 40 are combined at node V3. When node V3 rises above a switching threshold, PD is driven low.

Operation—FIG. 3

During normal operation when VIN+ is higher than VIN−, multiplier transistors 34, 36, which receive VIN− at their gates, have a greater transconductance than multiplier transistors 32, 38, which receive VIN+ at their gates. Multiplier transistors 32, 38 tend to turn off when VIN+ goes high.

Changes in current through p-channel differential transistor 24 are coupled to n-channel current-sink transistor 30 through multiplier transistor 34, while changes in current through p-channel differential transistor 26 are coupled to n-channel current-sink transistor 28 through multiplier transistor 36.

The lower VIN− causes more current to pass through p-channel differential transistor 24 than through differential transistor 26. The increased current through transistor 24 pulls more current from current-sink transistor 30, causing its gate and drain, node VM2, to rise in voltage. This higher VM2 voltage increases the current through n-channel transistor 46. The increased current sunk by transistor 46 increases the current through p-channel transistor 42, causing its gate voltage to fall and increase the current through p-channel transistor 44. This increases the pull-up current from node V3 and thus helps raise the voltage of node V3, and inverter 90 drives PD low (inactive).

The higher VIN+ produces less current through transistor 26. The reduced current through transistor 26 pulls less current from current-sink transistor 28, causing its gate and drain, node VM1, to fall in voltage. This lower VM1 voltage decreases the current through n-channel transistor 48. The lower current sourced by transistor 48 raises the voltage of node V3, and inverter 90 drives PD low (inactive).

During normal operation when VIN+ is lower than VIN−, multiplier transistors 34, 36, which receive VIN− at their gates, have a lower transconductance than multiplier transistors 32, 38, which receive VIN+ at their gates. Multiplier transistors 34, 36 tend to turn off when VIN− goes high.

Changes in current through p-channel differential transistor 24 are coupled to n-channel current-sink transistor 28 through multiplier transistor 32, while changes in current through p-channel differential transistor 26 are coupled to n-channel current-sink transistor 30 through multiplier transistor 38.

The lower VIN+ causes more current to pass through differential transistor 26 than through differential transistor 24. The increased current through transistor 26 pulls more current from current-sink transistor 30, causing its gate and drain, node VM2, to rise in voltage. This higher VM2 voltage increases the current through n-channel transistor 46. The increased current sourced by transistor 46 also increases the current through p-channel transistor 42, causing its gate voltage to fall and increase the current through p-channel transistor 44. This increases the pull-up current from node V3 and thus helps raise the voltage of node V3, and inverter 90 drives PD low (inactive).

The higher VIN− produces less current through transistor 24. The lower current through transistor 24 pulls less current from current-sink transistor 28, causing its gate and drain, node VM1, to fall in voltage. This lower VM1 voltage decreases the pull-down current thorough n-channel transistor 48. The lower current sourced by transistor 48 raises the voltage of node V3, and inverter 90 (FIG. 2) drives PD low (inactive).

Thus when either VIN− or VIN+ is lower, more current is sourced by current-sink transistor 30 than by transistor 28, and node VM1 is lower than VM2, driving node V3 high and PD low.

When VIN− and VIN+ are equal in voltage, the same current passes through all four multiplier transistors 32, 34, 36, 38, since these have the same size. Differential transistors 24, 26 also sink identical currents, since these two transistors are the same size. Thus sink currents through n-channel current-sink transistors 28, 30 are nearly identical, causing nodes VM1, VM2 to have the same voltage.

Since the voltage of VM1 is less when VIN−, VIN+ have a differential voltage, and more when VIN− and VIN+ are equal, the higher VM1 increases the current through transistor 48, causing node V3 to fall. The lower V3 is inverted by inverter 90, driving power-down signal PD high, activating the power-down mode.

Different sizes are used for n-channel transistors 46, 48 in second filter comparator 40. Transistor 46 is smaller than transistor 48, so that when VM1 and VM2 are equal, more current is sunk by transistor 48 than transistor 46. The smaller current in transistor 46 reduces the current through p-channel transistor 42, which is mirrored to reduce the pull-up current through p-channel transistor 44. The reduced pull-up current from node V3 helps to pulls down node V3.

Figure 4:
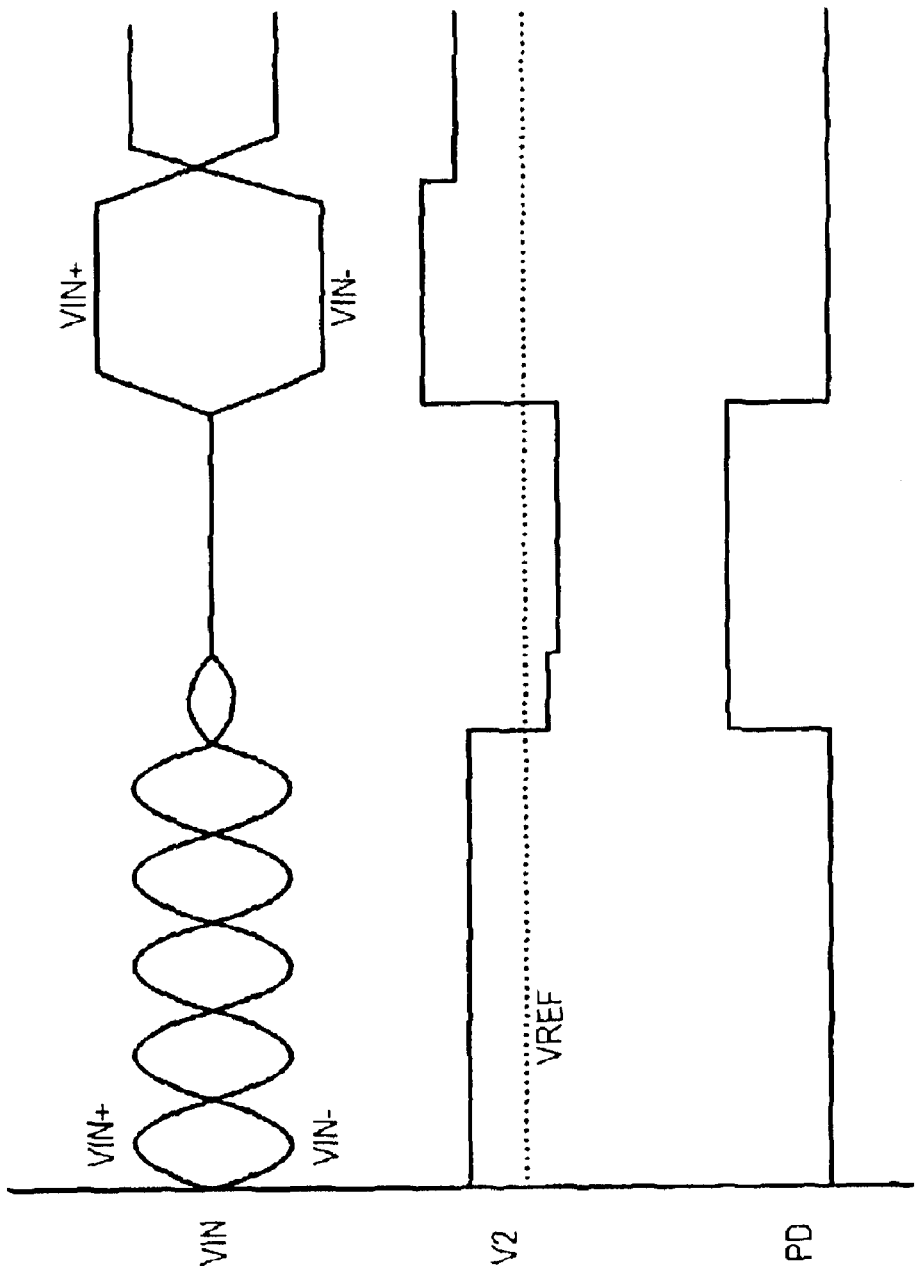
FIG. 4 is a waveform of operation of the equal-voltage power-down detector of FIGS. 2–3.

FIG. 4 is a waveform of operation of the equal-voltage power-down detector of FIGS. 2–3. When differential inputs VIN+, VIN− operate normally, as shown by the initial series of sine wave inputs, the square voltage difference V2 is above VREF. Power-down signal PD is low.

When the differential signal strength weakens, as for the last sine wave in the initial series, the averaged voltage difference V2 falls below VREF, although V2 is still above zero. Then the power-down signal PD is driven high to power-down the receiver or a sub-system or circuit that uses the differential receiver's output.

When the dirrerential inputs VIN+, VIN− fully equalize, V2 falls to zero. Since V2 is still below VREF, power-down signal PD remains active.

When VIN+, VIN− again diverge, as shown by the rectangular wave sequence at the right of the waveform, the large input-voltage difference causes V2 to rise above VREF. The power-down signal PD is driven low to deactivate the power-down mode. Note that different voltage differences produce different values of V2 that are still above VREF.

ALTERNATE EMBODIMENTS

Several other embodiments are contemplated by the inventor. For example other components such as capacitors, resistors, buffers, and transistors may be added. Inversions may be added using inverters or by swapping differential lines. Many choices for transistor device sizes could be made. Additional stages could be added. Other kinds of bias-voltage generators could be substituted, or an external bias voltage used. Input and output buffers and drivers could be added. The sensitivity and switching threshold of the detector may be adjusted by varying ratios of transistor sizes, such as the ratio of the sizes of transistors 68, 88.

First and second filter comparators 80, 40 may be combined so only one filter and comparator is needed. A voltage divider could be added before the multiplier to limit the Vin+ and Vin− DC bias voltage of the multiplier from 0 to Vdd/2 (if the multiplier in FIG. 3 is used), or from Vdd/2 to Vdd (if the multiplier in FIG. 2 is used). Thus, either differential multiplier 20 or 60 can work properly for input common mode voltage from 0 to Vdd.

Different filtering may be used, including addition of capacitors rather than using parasitic resistances and capacitances. Larger capacitance values can further smooth intra-cycle variations and prevent false triggering at cross-over when VIN+, VIN− are momentarily equal. Other kinds of multipliers could be substituted.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A differential equal-voltage detector comprising:
   a differential input including a true differential input and a complement differential input, the true and complement differential inputs being driven to opposite states during normal operation, but the true and complement differential inputs being equalized to an equal voltage when an input-failure occurs;
   a multiplier, receiving the true and complement differential inputs, for squaring a voltage difference between the true and complement differential inputs to generate a squared voltage;
   a low-pass filter, coupled to the multiplier, for filtering the squared voltage to smooth variations in the squared voltage to generate an averaged voltage; and
   a comparator, coupled to receive the averaged voltage, for comparing the averaged voltage to a reference voltage, and for activating a detect signal when the averaged voltage is below the reference voltage,
   whereby the detect signal is activated when the voltage difference is below a threshold to signal the input-failure.

2. The differential equal-voltage detector of claim 1 further comprising:
   a driver, receiving the detect signal for activating a power-down signal that powers down a circuit that processes signals carried by the differential input when the detect signal is activated,
   whereby power-down occurs when the input-failure is detected by detecting equal differential voltages.

3. The differential equal-voltage detector of claim 2 wherein the multiplier is a Gilbert cell.

4. The differential equal-voltage detector of claim 3 wherein the Gilbert cell comprises:
   a current sink;
   a first current source for sourcing a first current;
   a second current source for sourcing a second current;
   a first differential transistor that conducts a first current between a first differential node and the current sink, the first current being responsive to a gate that receives the complement differential input,
   a first multiplier transistor that conducts current between the first current source and the first differential node in response to a gate that receives the complement differential input;
   a first crossover multiplier transistor that conducts current between the second current source and the first differential node in response to a gate that receives the true differential input;
   a second differential transistor that conducts a second current between a second differential node and the current sink, the second current being responsive to a gate that receives the true differential input,
   a second multiplier transistor that conducts current between the second current source and the second differential node in response to a gate that receives the complement differential input;
   a second crossover multiplier transistor that conducts current between the first current source and the second differential node in response to a gate that receives the true differential input.

5. The differential equal-voltage detector of claim 4 wherein a first output of the Gilbert cell is a first node between the first current source and the first multiplier transistor;

wherein a second output of the Gilbert cell is a second node between the second current source and the second multiplier transistor.

6. The differential equal-voltage detector of claim 5 wherein the first and second differential transistors, the first multiplier transistor, the first crossover multiplier transistor, the second multiplier transistor, and the second crossover multiplier transistor are n-channel transistors.

7. The differential equal-voltage detector of claim 5 wherein the low-pass filter comprises:
 a differential-to-single-ended buffer that receives the first and second outputs from the Gilbert cell, and drives a capacitance with the averaged voltage.

8. The differential equal-voltage detector of claim 7 wherein the capacitance is a filter capacitor or a gate capacitance of a buffer.

9. The differential equal-voltage detector of claim 8 further comprising:
 a complement Gilbert cell for operating at reduced input voltages, receiving the true and complement differential inputs, for squaring a voltage difference between the true and complement differential inputs to generate a second squared voltage;
 a complement a low-pass filter, coupled to the complement Gilbert cell, for filtering the second squared voltage to smooth variations in the second squared voltage to further generate the averaged voltage.

10. The differential equal-voltage detector of claim 9 wherein the comparator comprises an inverter that receives the averaged voltage, the inverter having a switching threshold at the reference voltage, wherein when the averaged voltage is above the switching threshold the inverter drives the detect signal into a first state, but when the averaged voltage is below the switching threshold the inverter drives the detect signal into a second state.

11. A power-down detector comprising:
 a true differential line and a complement differential line having a voltage difference when driven, but having substantially equal voltages when not driven;
 a tail current sink between a tail node and a ground;
 a first current source between a power supply and a first intermediate node;
 a second current source between the power supply and a second intermediate node;
 a first differential transistor between a first branch node and the tail node, having a gate receiving the complement differential line;
 a first select transistor between the first intermediate node and the first branch node, having a gate receiving the complement differential line;
 a first crossover transistor between the second intermediate node and the first branch node, having a gate receiving the true differential line;
 a second differential transistor between a second branch node and the tail node, having a gate receiving the true differential line;
 a second select transistor between the second intermediate node and the second branch node, having a gate receiving the complement differential line;
 a second crossover transistor between the first intermediate node and the second branch node, having a gate receiving the true differential line;
 a differential converter, receiving the first and second intermediate nodes, for driving a filter capacitance to a first state when the substantially equal voltages are detected on the true and complement differential lines, but for driving the filter capacitance to a second state when the voltage difference is detected between the true and complement differential lines; and
 a sensing stage for sensing the first and second states on the filter capacitance, for activating a power-down mode when the first state is sensed,
 whereby power down is activated by detecting substantially equal voltages on the true and complement differential lines.

12. The power-down detector of claim 11 wherein the filter capacitance is a filter capacitor or is a gate capacitance of one or more transistors in the sensing stage.

13. The power-down detector of claim 11 wherein the first current source comprises a first current source transistor having a gate and a drain coupled together and to the first intermediate node; and
 wherein the second current source comprises a second current source transistor having a gate and a drain coupled together and to the second intermediate node.

14. The power-down detector of claim 11 further comprising an alternate stage that comprises:
 an alternate tail current source between an alternate tail node and the power supply;
 an alternate first current sink between the ground and an alternate first intermediate node;
 an alternate second current sink between the power supply and an alternate second intermediate node;
 an alternate first differential transistor between an alternate first branch node and the alternate tail node, having a gate receiving the complement differential line;
 an alternate first select transistor between the alternate first intermediate node and the alternate first branch node, having a gate receiving the true differential line;
 an alternate first crossover transistor between the alternate second intermediate node and the alternate first branch node, having a gate receiving the complement differential line;
 an alternate second differential transistor between an alternate second branch node and the alternate tail node, having a gate receiving the true differential line;
 an alternate second select transistor between the alternate second intermediate node and the alternate second branch node, having a gate receiving the true differential line;
 an alternate second crossover transistor between the alternate first intermediate node and the alternate second branch node, having a gate receiving the complement differential line;
 an alternate differential converter, receiving the alternate first intermediate node and the alternate second intermediate node, for driving the filter capacitance to the first state when the substantially equal voltages are detected on the true and complement differential lines, but for driving the filter capacitance to the second state when the voltage difference is detected between the true and complement differential lines.

15. The power-down detector of claim 14 wherein the first differential transistor, the second differential transistor, the first select transistor, the second select transistor, the first crossover transistor, and the second crossover transistor are n-channel transistors;
 wherein the alternate first differential transistor, the alternate second differential transistor, the alternate first select transistor, the alternate second select transistor, the alternate first crossover transistor, and the alternate second crossover transistor are p-channel transistors.

16. An equal-voltage detector comprising:

a current sink;

a first current source generating a current controlled by a first intermediate node;

a second current source generating a current controlled by a second intermediate node;

a first differential transistor having a gate receiving a complement differential signal, a source coupled to the current sink, and a drain coupled to a first branch node;

a first select transistor having a gate receiving the complement differential signal, a source coupled to the first branch node, and a drain coupled to the first current source;

a first crossover transistor having a gate receiving a true differential signal, a source coupled to the first branch node, and a drain coupled to the second current source;

a second differential transistor having a gate receiving the true differential signal, a source coupled to the current sink, and a drain coupled to a second branch node;

a second select transistor having a gate receiving the complement differential signal, a source coupled to the second branch node, and a drain coupled to the second current source;

a second crossover transistor having a gate receiving the true differential signal, a source coupled to the second branch node, and a drain coupled to the first current source;

a converter, receiving the first and second intermediate nodes, for driving an averaging node to a first state when the true and complement differential signals are substantially at a same voltage, but for driving the averaging node to a second state when the true and complement differential signals are substantially at different voltages;

a sensing buffer, having the averaging node as an input, for activating a detected signal when the averaging node is driven to the first state.

17. The equal-voltage detector of claim 16 wherein the converter comprises:

a first receiving transistor with a gate that receives the first intermediate node, and a drain driving the averaging node;

a first mirror transistor with a drain driving the averaging node, and a gate coupled to a mirror node;

a second receiving transistor with a gate that receives the second intermediate node, and a drain driving the mirror node;

a second mirror transistor with a drain driving the mirror node, and a gate coupled to the mirror node.

18. The equal-voltage detector of claim 17 wherein the current sink comprises a n-channel transistor;

wherein the first current source comprises a p-channel transistor having a gate and a drain connected to the first intermediate node;

wherein the second current source comprises a p-channel transistor having a gate and a drain connected to the second intermediate node;

wherein the first receiving transistor and the second receiving transistor are p-channel transistors;

wherein the first mirror transistor and the second mirror transistor are n-channel transistors;

wherein the first differential transistor, the first select transistor, the first crossover transistor, the second differential transistor, the second select transistor, and the second crossover transistor are n-channel transistors.

19. The equal-voltage detector of claim 18 further comprising:

a second current source;

a second current sink generating a current controlled by a third intermediate node;

a third current sink generating a current controlled by a fourth intermediate node;

a third differential transistor having a gate receiving a complement differential signal, a source coupled to the second current source, and a drain coupled to a third branch node;

a third select transistor having a gate receiving the true differential signal, a source coupled to the third branch node, and a drain coupled to the second current sink;

a third crossover transistor having a gate receiving a complement differential signal, a source coupled to the third branch node, and a drain coupled to the third current sink;

a fourth differential transistor having a gate receiving the true differential signal, a source coupled to the second current source, and a drain coupled to a fourth branch node;

a fourth select transistor having a gate receiving the true differential signal, a source coupled to the fourth branch node, and a drain coupled to the third current sink;

a fourth crossover transistor having a gate receiving the complement differential signal, a source coupled to the fourth branch node, and a drain coupled to the second current sink;

a second converter, receiving the third and fourth intermediate nodes, for also driving the averaging node to the first state when the true and complement differential signals are substantially at the same voltage, but for driving the averaging node to the second state when the true and complement differential signals are substantially at different voltages.

20. The equal-voltage detector of claim 19 wherein the third differential transistor, the third select transistor, the third crossover transistor, the fourth differential transistor, the fourth select transistor, and the fourth crossover transistor are p-channel transistors.

* * * * *